United States Patent [19]
Filliman

[11] Patent Number: 4,502,079
[45] Date of Patent: Feb. 26, 1985

[54] SIGNAL SAMPLING NETWORK WITH REDUCED OFFSET ERROR

[75] Inventor: Paul Filliman, Indianapolis, Ind.

[73] Assignee: RCA Corporation, New York, N.Y.

[21] Appl. No.: 437,827

[22] Filed: Oct. 29, 1982

[51] Int. Cl.³ .............................................. H04N 5/68
[52] U.S. Cl. ...................................... 358/243; 358/27; 358/74
[58] Field of Search ...................... 358/27, 29, 34, 64, 358/65, 74, 171, 172, 242, 243; 307/350, 351, 352, 353; 328/151, 168, 169, 172, 175

[56] References Cited

U.S. PATENT DOCUMENTS

| | | | |
|---|---|---|---|
| 4,331,981 | 5/1982 | Parker | 358/243 |
| 4,387,405 | 6/1983 | Hinn | 358/243 |
| 4,414,577 | 11/1983 | Tallant | 358/242 |

Primary Examiner—Tommy P. Chin
Attorney, Agent, or Firm—Eugene M. Whitacre; Paul J. Rasmussen; Ronald H. Kurdyla

[57] ABSTRACT

A signal clamping and sampling system wherein signals to be sampled are applied to a voltage amplifier The output of the voltage amplifier is coupled in common to the inputs of first and second matched operational transconductance amplifiers (OTA's). s). During an initial clamping reference interval, the first OTA conducts to form a feedback clamping network for establishing input and output reference bias conditions for the voltage amplifier. The second OTA conducts during a subsequent sampling interval for processing signals to be sampled. The output reference bias of the voltage amplifier determines substantially identical input bias conditions for both the first and second OTA's, thereby significantly reducing the likelihood of signal processing offset errors being produced as between the clamping and sampling intervals when the first and second OTA's are respectively conductive.

19 Claims, 4 Drawing Figures

SIGNAL SAMPLING NETWORK WITH REDUCED OFFSET ERROR

This invention concerns an arrangement particularly suitable for sampling a characteristic of a low level electrical signal, in a manner which significantly reduces distortion of an output sample by sampling offset errors.

In signal processing systems such as a television receiver, there is a need to sample information contained in signals processed by the system. It is often necessary to provide significant amplification in the sampling process in order to obtain an information sample with a level large enough to be utilized effectively by circuits which are intended to process the information sample. This requirement is evident, for example, in a system for automatically controlling the bias of a kinescope in a television receiver. In such a system it is often necessary to sample the variable amplitude of a small pulse of a few millivolts peak-to-peak amplitude, for the purpose of developing a control signal capable of automatically controlling kinescope bias over a range of several volts. A system of this type is described in U.S. Pat. No. 4,331,981 of R. P. Parker, for example.

The need for amplifying low level signals in the sampling process requires that offset errors associated with the sampling process be small, since large offset errors can distort or obscure the output information sample. Linear operation of the sampling network is also desirable to avoid distortion of the output sample. These objectives are satisfied by a high gain signal sampling network according to the principles of the present invention.

Signal sampling apparatus according to the present invention includes input and output capacitances, and first and second amplifiers with inputs coupled to the input capacitance, and respective outputs. The output of the first amplifier and a source of reference voltage are selectively coupled to the input capacitance during a reference interval, preceding a sampling interval, for establishing a reference bias condition for the input capacitance and a related reference bias condition for the first and second amplifiers. The output of the second amplifier is selectively coupled to the output capacitance during the sampling interval. The first and second amplifiers produce substantially the same output signal at the end of the reference interval.

In accordance with a feature of the invention the first and second amplifiers correspond to transconductance amplifiers.

In accordance with a further feature of the invention, the sampling apparatus is associated with a system for automatically controlling the bias of a kinescope in a television receiver, wherein the sampling apparatus processes small signals representative of the kinescope bias.

Figure 1:
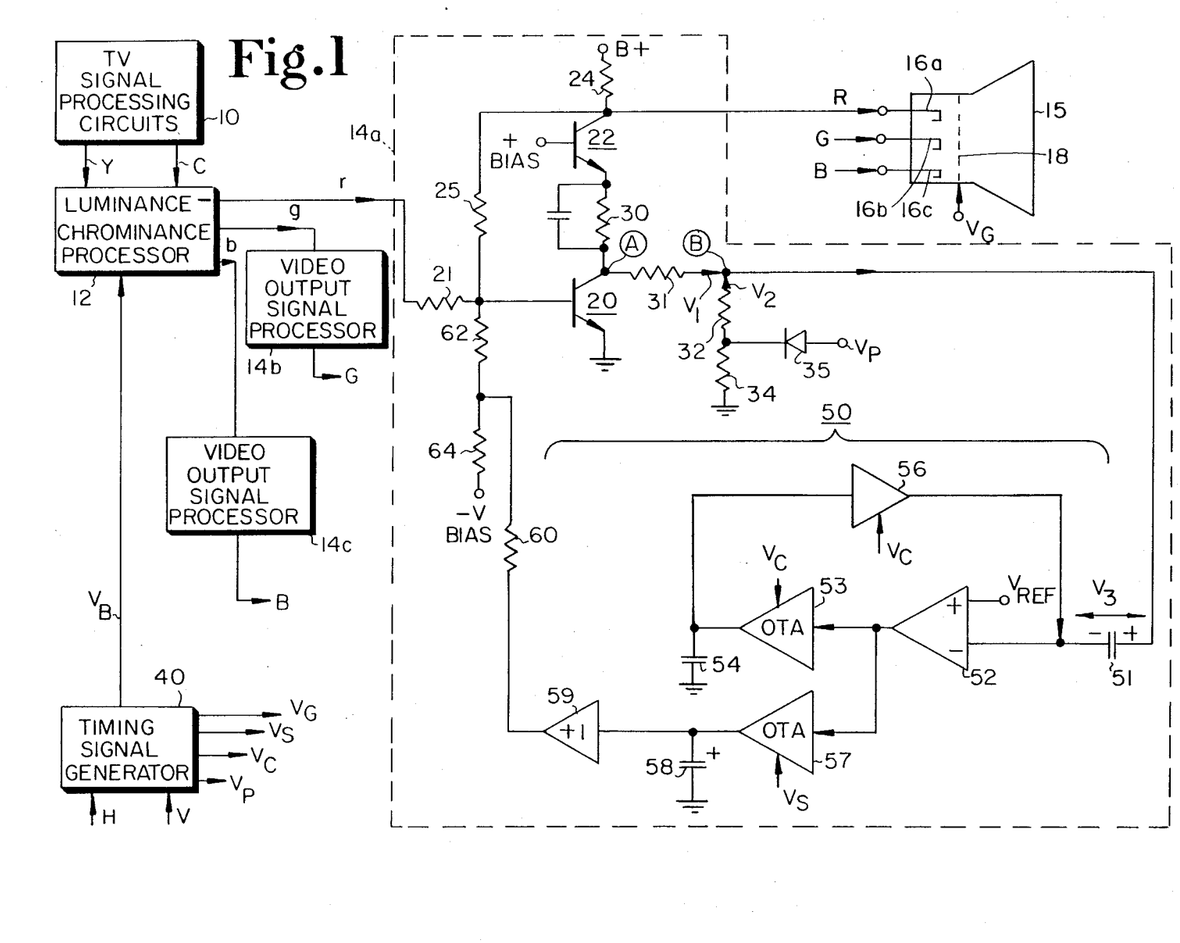
FIG. 1 shows a portion of a color television receiver including an automatic kinescope bias control system and an associated signal sampling network embodying the principles of the present invention.

In FIG. 1, television signal processing circuits 10 provide separated luminance (Y) and chrominance (C) components of a composite color television signal to a luminance-chrominance signal processing network 12. Processor 12 includes luminance and chrominance gain control circuits, DC level setting circuits (e.g., comprising keyed black level clamping circuits), color demodulators for developing r-y, g-y and b-y color difference signals, and matrix amplifiers for combining the latter signals with processed luminance signals to provide low level color image representative signals r, g and b. These signals are amplified and otherwise processed by circuits within video output signal processing networks 14a, 14b and 14c, respectively, which supply high level amplified color image signals R, G and B to respective cathode intensity control electrodes 16a, 16b and 16c of a color kinescope 15. Networks 14a, 14b and 14c also perform functions related to the automatic kinescope bias (AKB) control function, as will be discussed. Kinescope 15 is of the self-converging in-line gun type with a commonly energized control grid 18 associated with each of the electron guns comprising cathode electrodes 16a, 16b and 16c.

Since output signal processors 14a, 14b and 14c are similar in this embodiment, the following discussion of the operation of processor 14a also applies to processors 14b and 14c.

Processor 14a includes a kinescope driver stage comprising an input transistor 20 configured as a common emitter amplifier which receives video signal r from processor 12 via an input resistor 21, and an output high voltage transistor 22 configured as a common base amplifier which together with transistor 20 forms a cascode video driver amplifier. High level video signal R, suitable for driving kinescope cathode 16a, is developed across a load resistor 24 in the collector output circuit of transistor 22. Direct current negative feedback for driver 20, 22 is provided by means of a resistor 25. The signal gain of cascode amplifier 20, 22 is primarily determined by the ratio of the value of feedback resistor 25 to the value of input resistor 21.

A sensing resistor 30 DC coupled in series with and between the collector-emitter paths of transistors 20, 22 serves to develop a voltage, at a relatively low voltage sensing node A, representing the level of kinescope cathode black current conducted during kinescope blanking intervals. Resistor 30 functions in conjunction with the AKB system of the receiver, which will now be described.

A timing signal generator 40 containing combinational and sequential logic control circuits as well as level shifting circuits responds to periodic horizontal synchronizing rate signals (H) and to periodic vertical synchronizing rate signals (V), both derived from deflection circuits of the receiver, for generating timing signals $V_B$, $V_S$, $V_C$, $V_P$ and $V_G$ which control the operation of the AKB function during periodic AKB intervals. Each AKB interval begins shortly after the end of the vertical retrace interval within the vertical blanking interval, and encompasses several horizontal line intervals also within the vertical blanking interval and during which video signal image information is absent. These timing signals are illustrated by the waveforms in FIG. 2.

Figure 2:
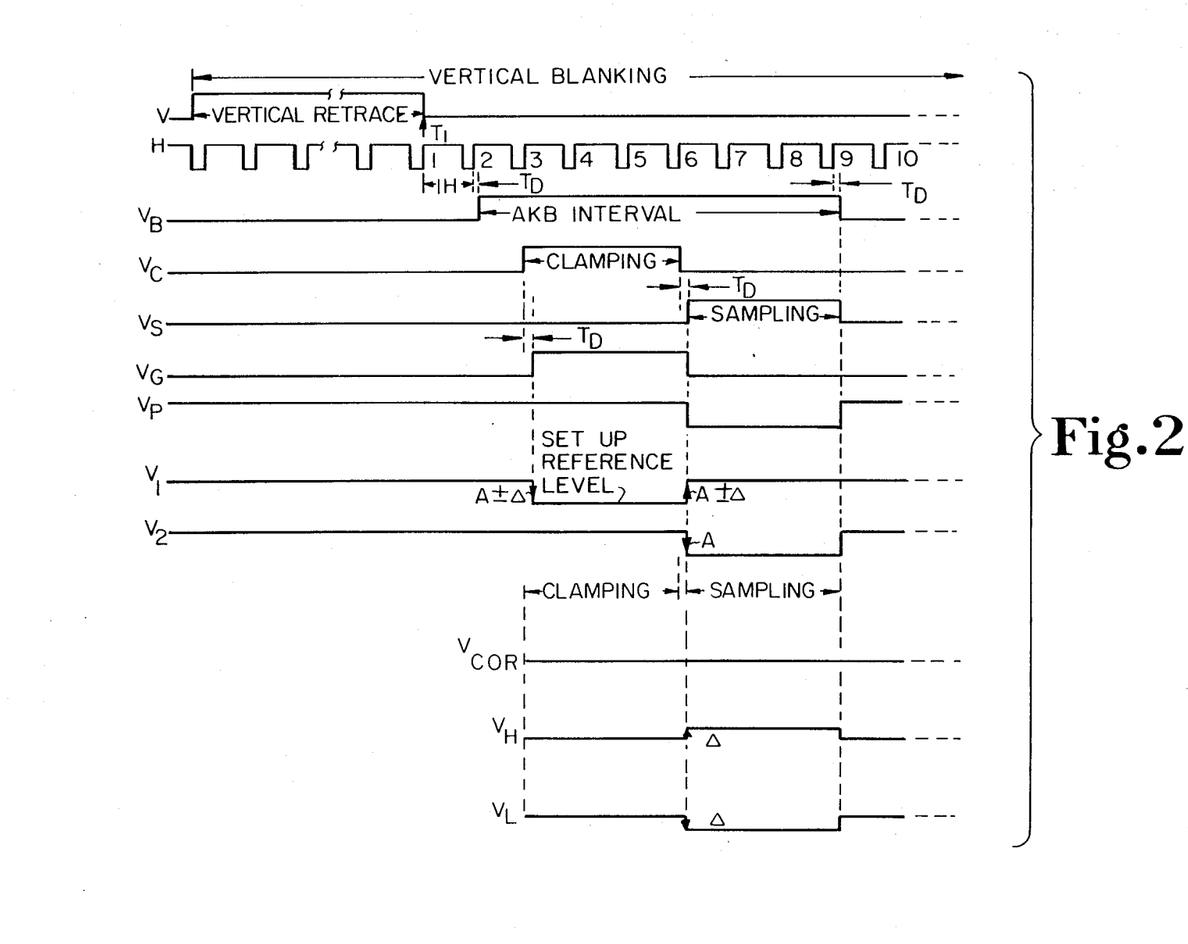
FIG. 2 illustrates signal waveforms associated with the operation of the system in FIG. 1.

Referring to FIG. 2 for the moment, timing signal $V_B$, used as a video blanking signal, comprises a positive pulse generated soon after the vertical retrace interval ends at time $T_1$, as indicated by reference to signal waveform V. Blanking signal $V_B$ exists for the duration of the AKB interval and is applied to a blanking control input terminal of luminance-chrominance processor 12 for causing the r, g and b outputs of processor 12 to exhibit a black image representative DC reference level corresponding to the absence of video signals. This can be accomplished by reducing the signal gain of processor 12 to substantially zero via the gain control circuits of processor 12 in response to signal $V_B$, and by modifying the DC level of the video signal processing path via the DC level control circuits of processor 12 to produce a black image representative reference level at the signal outputs of processor 12. Timing signal $V_G$, used as a positive grid drive pulse, encompasses three horizontal line intervals within the vertical blanking interval. Timing signal $V_C$ is used to control the operation of a clamping circuit associated with the signal sampling function of the AKB system. Timing signal $V_S$, used as a sampling control signal, occurs after signal $V_C$ and serves to time the operation of a sample and hold circuit which develops a DC bias control signal for controlling the kinescope cathode black current level. Signal $V_S$ encompasses a sampling interval the beginning of which is slightly delayed relative to the end of the clamping interval encompassed by signal $V_C$, and the end of which substantially coincides with the end of the AKB interval. A negative-going auxiliary pulse $V_P$ coincides with the sampling interval. Signal timing delays $T_D$ indicated in FIG. 2 are on the order of 200 nanoseconds.

Referring again to FIG. 1, during the AKB interval positive pulse $V_G$ (e.g., on the order of +10 volts) forward biases grid 18 of the kinescope, thereby causing the electron gun comprising cathode 16a and grid 18 to increase conduction. At times other than the AKB intervals, signal $V_G$ provides the normal, less positive, bias for grid 18. In response to positive grid pulse $V_G$, a similarly phased, positive current pulse appears at cathode 16a during the grid pulse interval. The amplitude of the cathode output current pulse so developed is proportional to the level of cathode black current conduction (typically a few microamperes).

The induced positive cathode output pulse appears at the collector of transistor 22, and is coupled to the base input of transistor 20 via resistor 25, causing the current conduction of transistor 20 to increase proportionally while the cathode pulse is present. The increased current conducted by transistor 20 causes a voltage to be developed across sensing resistor 30. This voltage is in the form of a negative-going voltage change which appears at sensing node A and which is proportional in magnitude to the magnitude of the black current representative cathode output pulse. The magnitude of the voltage perturbation at node A is determined by the product of the value of resistor 30 times the magnitude of the perturbation current flowing through resistor 30. The voltage change at node A is coupled via a small resistor 31 to a node B at which a voltage change $V_1$, essentially corresponding to the voltage change at node A, is developed. Node B is coupled to a bias control voltage processing network 50.

Network 50 performs signal clamping and sampling functions. The clamping function is performed during clamping intervals within the AKB interval by means of a feedback clamping network comprising an input AC coupling capacitor 51, an operational amplifier 52 which functions as a voltage amplifier, a keyed operational transconductance amplifier (OTA) 53, a filter capacitor 54, and a keyed buffer amplifier 56 (e.g., comprising an emitter follower stage) which acts as an electronic switch. The sampling function is performed during a sampling interval, following the clamping interval during each AKB interval, by means of a network comprising amplifier 52, a keyed operational transconductance amplifier (OTA) 57, and an average responding charge storage capacitor 58. A kinescope bias correction voltage is developed across capacitor 58 and is coupled via a low output impedance buffer amplifier 59 and a resistor network 60, 62, 64 to the kinescope driver via a bias control input at the base of transistor 20. The correction voltage developed across capacitor 58 serves to automatically maintain a desired correct level of kinescope black current conduction. The bias correction voltage developed across storage capacitor 58 is a function of both voltage change $V_1$ developed at node B during the clamping interval, and a voltage change $V_2$ developed at node B during the subsequent sampling interval, as will be discussed in greater detail subsequently in connection with the waveforms shown in FIG. 2.

During the clamping set-up reference interval, both OTA 53 and switch 56 are rendered conductive in response to clamping control signal $V_C$. At this time OTA 57 is non-conductive so that the charge on storage capacitor 58 remains unaffected during the clamping interval. As a consequence of the feedback action during the clamping interval, the inverting (−) input of voltage amplifier 52, to which input capacitor 51 is coupled, is referenced to (i.e., clamped to) a voltage which is a function of a fixed reference voltage $V_{REF}$ applied to the non-inverting input (+) of amplifier 52. At this time the voltage across input capacitor 51 is a function of the level of voltage change $V_1$ developed at node B, and the input voltage of amplifier 52 provided via the feedback action.

During the following sampling interval when voltage change $V_2$ is developed at node B, OTA 53 and switch 56 are rendered non-conductive, and OTA 57 is rendered conductive in response to sampling control signal $V_S$. The magnitude of voltage change $V_2$ is indicative of the magnitude of the kinescope black current level, and is sampled by means of amplifier 52 and OTA 57 to develop a corresponding voltage across storage capacitor 58.

The signal gain associated with the open loop sampling process is very high, and is determined by the product of the voltage gain of input amplifier 52 (approximately 40), the transconductance gain ($g_m$) of OTA 57 (approximately 0.1 mhos), and the impedance presented to the output of OTA 57 (approximately 1 Megohm). Very high sampling gain is required because voltage changes $V_1$ and $V_2$, which are representative of the magnitude of the kinescope black current level as will be discussed, are very small (on the order of a few millivolts).

Because the representative signals being processed by network 50 are very small it is also necessary to assure the offset errors associated with the signal clamping and sampling function of network 50 are kept small, since otherwise the bias correction control voltage developed across storage capacitor 58 will be distorted. This is accomplished by the illustrated arrangement of operational transconductance amplifiers 53 and 57.

Operational transconductance amplifiers 53 and 57, respectively associated with the clamping and sampling functions, convert input voltage variations to output current variations. Preferably both are similar (i.e., closely matched). The inputs of both OTA 53 and OTA 57 are supplied in commmon from the output of amplifier 52.

The feedback action provided during the clamping interval causes the inputs of amplifier 52 to exhibit a balanced condition prior to the end of the clamping reference interval, whereby the voltage at the inverting input of amplifier 52 is caused to be substantially equal to reference voltage $V_{REF}$ at the non-inverting input of amplifier 52. Thus the differential input voltage of amplifier 52 is substantially zero, whereby amplifier 52 is biased for balanced, linear operation. This condition corresponds to the reference condition for the following sampling operation.

Amplifier 52 produces a substantially zero output voltage due to the balanced input bias. It is noted that the input bias for OTA 53 is derived from the (zero) output voltage of amplifier 52. Accordingly, the output current of OTA 53 is substantially zero. This means that OTA 53 is also properly biased for linear operation, consistent with the bias of amplifier 52.

It is also noted that the input bias of OTA 57 is also derived from the output of amplifier 52. Since OTA 53 and OTA 57 are closely matched with respect to operating characteristics, OTA 57 is also properly biased for linear operation in the same manner as OTA 53. Thus at the end of the clamping interval, just prior to the sampling interval, OTA 53 and OTA 57 are both biased to exhibit virtually identical, substantially zero, output currents. The input circuits of buffer amplifier 59 and switch 56 are also preferably closely matched.

In this system the voltage $V_3$ across input capacitor 51 and the voltage applied to the inverting input of amplifier 52, will not change if voltage changes $V_1$ and $V_2$ are equal, thereby representing a correct kinescope black current level. In such case the balanced input bias of amplifier 52 as established during the clamping interval remains unchanged during the sampling interval, whereby the substantially zero output current of OTA 57 remains unchanged and the control voltage across storage capacitor 58 remains unchanged. The disclosed arrangement of matched OTA 53 and OTA 57 significantly reduces the likelihood of an offset error being exhibited during the sampling process relative to the clamping process, due to the matching of output currents of OTA 53 and OTA 57 during the clamping and sampling intervals. Accordingly, the likelihood of a distorted control voltage across capacitor 58 is significantly reduced. If OTA 53 and OTA 57 are different, the output current of OTA 57 can assume a value other than zero during the sampling interval for a condition of correct kinescope bias, even though the output current of OTA 53 is substantially zero at the end of the preceding clamping reference interval. Such non-zero output current of OTA 57 would cause the voltage across output storage capacitor to change, which is undesirable since the voltage across capacitor 58 should not change when kinescope bias is correct.

When the kinescope black current level is too high or too low, the voltages supplied to input capacitor 51 will unbalance the inputs of amplifier 52 and will cause storage capacitor 58 to be charged or discharged via OTA 57 during the sampling process, so as to maintain a correct kinescope bias corresponding to the desired black current level.

Capacitor 54 stabilizes the clamping feedback loop of network 50 against oscillation, and also retains a residual voltage charge from the previous clamping interval. The latter feature permits the balanced input condition of amplifier 52 to be established more quickly by feedback action, by reducing the time required to modify the charge on input capacitor 51 via switch 56.

The transconductance gain of sampling OTA 57 is preferably significantly less than the voltage gain of amplifier 52 so that the signal gain of the feed-forward sampling path comprising voltage amplifier 52 and OTA 57 is preferably primarily determined by the gain of voltage amplifier 52. Since OTA 53 and 57 are preferably matched, they exhibit substantially equal gain. Relatively smaller gains for OTA 53 and 57 is desirable to minimize the effects of any differences in the operating characteristics of OTA 53 and 57.

The sampling path preferably comprises a transconductance amplifier (OTA 57), rather than a voltage amplifier, in order to provide a more reliably accurate control voltage across output storage capacitor 58 and to reduce the likelihood of a steady-state system error (i.e., when the AKB control loop is quiescent). OTA 57 incrementally charges and discharges capacitor 58 by sourcing and sinking current to and from capacitor 58 in accordance with incremental changes in the input voltage of OTA 57.

Feedback switch 56, when non-conductive (open) during the sampling interval, assures that the amount by which capacitor 54 can discharge during the sampling interval is very small. When non-conductive, switch 56 also decouples the feedback path from input capacitor 51 and the input of amplifier 52, to prevent interaction between the clamping and sampling signal paths during the sampling interval.

Keyed buffer 56 comprises a unity gain voltage amplifier with a high input impedance and a low output impedance capable of supplying a reasonably high current (up to about 10 milliamperes) to input capacitor 51 (0.12 microfarads) during the clamping reference interval. This charging current capability is required to assure that the clamping reference voltage is established across capacitor 51 before the clamping interval ends. Keyed network 56 can be of the type disclosed in my copending concurrently filed U.S. patent application Ser. No. 437,828 titled "Switching Network with Suppressed Switching Transients", incorporated herein by reference.

Following is a more detailed discussion of the clamping and sampling operation of network 50, made with reference to the waveforms of FIG. 2.

Auxiliary signal $V_P$ is applied to circuit node B in FIG. 1 via a diode 35 and a voltage translating impedance network comprising resistors 32 and 34, e.g., with values of 220 kilohms and 270 kilohms, respectively. Signal $V_P$ exhibits a positive DC level of approximately +8.0 volts at all times except during the AKB sampling interval, for maintaining diode 35 conductive so that a normal DC bias voltage is developed at node B. When the positive DC component of signal $V_P$ is present, the junction of resistors 32 and 34 is clamped to a voltage equal to the positive DC component of signal $V_P$, minus the voltage drop across diode 35. Signal $V_P$ manifests a negative-going, less positive fixed amplitude pulse component during the AKB sampling interval. Diode 35 is rendered non-conductive in response to negative pulse $V_P$, whereby the junction of resistors 32 and 34 is unclamped. Resistor 31 causes insignificant attenuation of the voltage change developed at node A relative to the corresponding voltage change ($V_1$) developed at node B since the value of resistor 31 (on the order of 200 ohms) is small relative to the values of resistors 32 and 34.

Prior to clamping interval but during the AKB interval, the pre-existing nominal DC voltage ($V_{DC}$) appearing at node B charges the positive terminal of capacitor 51. During the clamping interval when grid drive pulse $V_G$ is developed, the voltage at node A decreases in response to pulse $V_G$ by an amount representative of the black current level. This causes the voltage at node B to decrease to a level substantially equal to $V_{DC}-V_1$. Also during the clamping interval, timing signal $V_C$ causes clamping switch 56 to close (i.e., conduct) whereby the inverting (−) signal input of amplifier 52 is coupled to its output via amplifiers 53 and switch 56, thereby configuring amplifier 52 as a voltage follower amplifier. As a result, the fixed DC reference voltage $V_{REF}$ (e.g., +6 volts) applied to a non-inverting input (+) of amplifier 52 is translated by feedback action to the inverting signal input of amplifier 52, for producing the balanced input bias condition discussed previously. During the clamping interval, voltage $V_3$ across capacitor 51 is a function of a reference set-up voltage related to voltage $V_{REF}$ at the negative terminal of capacitor 51, and a voltage at the positive terminal of capacitor 51 corresponding to the difference between the described pre-existing nominal DC level ($V_{DC}$) at node B and voltage change $V_1$ developed at node B during the clamping interval. Thus voltage $V_3$ across capacitor 51 during the clamping reference interval is a function of the level of black current representative voltage change $V_1$, which may vary. Voltage $V_3$ can be expressed as $(V_{DC}-V_1)-V_{REF}$.

During the immediately following sampling interval, positive grid drive pulse $V_G$ is absent, causing the voltage at node B to increase positively to the pre-existing nominal DC level $V_{DC}$ that appeared prior to the clamping interval. Simultaneously, negative pulse $V_P$ appears, reverse biasing diode 35 and perturbing (i.e., momentarily changing) the normal voltage translating and coupling action of resistors 32, 34 such that the voltage at node B is reduced by an amount $V_2$ as indicated in FIG. 2. At the same time, clamping switch 56 and OTA 53 are rendered non-conductive and OTA 57 conducts in response to signal $V_S$.

Thus during the sampling interval the input voltage applied to the inverting signal input (−) of amplifier 52 is equal to the difference between the voltage at node B and voltage $V_3$ across input capacitor 51. The input voltage applied to amplifier 52 is a function of the magnitude of voltage change $V_1$, which can vary with changes in the kinescope black current level.

The voltage on output storage capacitor 58 remains unchanged during the sampling interval when the magnitude of voltage change $V_1$ developed during the clamping interval equals the magnitude of voltage change $V_2$ developed during the sampling interval, indicating a correct kinescope black current level. This results because during the sampling interval, voltage change $V_1$ at node B increases in a positive direction (from the clamping set-up reference level) when the grid drive pulse is removed, and voltage change $V_2$ causes a simultaneous negative-going voltage perturbation at node B. When kinescope bias is correct, positive-going voltage change $V_1$ and negative-going voltage change $V_2$ exhibit equal magnitudes whereby these voltage changes mutually cancel during the sampling interval, leaving the voltage at node B unchanged.

When the magnitude of voltage change $V_1$ is less than the magnitude of voltage change $V_2$, amplifier 52 proportionally charges storage capacitor 58 via OTA 57 in a direction for increasing cathode black current conduction. Conversely, amplifier 52 proportionally discharges storage capacitor 58 via OTA 57 for causing decreased cathode black current conduction when the magnitude of voltage change $V_1$ is greater than the magnitude of voltage change $V_2$.

As more specifically shown by the waveforms of FIG. 2, the amplitude "A" of voltage change $V_1$ is assumed to be approximately three millivolts when the cathode black current level is correct, and varies over a range of a few millivolts ($\pm \Delta$) as the cathode black current level increases and decreases relative to the correct level as the operating characteristics of the kinescope change. Thus the clamping interval set-up reference voltage across capacitor $V_3$ varies with changes in the magnitude of voltage $V_1$ as the cathode black current level changes. Voltage change $V_2$ at node B exhibits an amplitude "A" of approximately three millivolts, which corresponds to amplitude "A" associated with voltage change $V_1$, when the black current level is correct.

As indicated by waveform $V_{COR}$ in FIG. 2 corresponding to a condition of correct kinescope bias, the voltage at the inverting input of amplifier 52 remains unchanged during the sampling interval when voltages $V_1$ and $V_2$ are both of amplitude "A". However, as indicated by waveform $V_H$, the input voltage of amplifier 52 increases by an amount $\Delta$ when voltage change $V_1$ exhibits amplitude "A+$\Delta$", corresponding to a high black current level. In this event amplifier 52 discharges output storage capacitor 58 via OTA 57, so that the bias control voltage applied to the base of transistor 20 causes the collector voltage of transistor 22 to increase, whereby the cathode black current decreases toward the correct level.

Conversely, and as indicated by waveform $V_L$, the input voltage of amplifier 52 decreases by an amount $\Delta$ during the sampling interval when voltage change $V_1$ exhibits amplitude "A−$\Delta$", corresponding to a low black current level. In this case amplifier 52 charges output storage capacitor 58 via OTA 57, causing the collector voltage of transistor 22 to decrease whereby the cathode black current increases toward the correct level. In either case, several sampling intervals may be required to achieve the correct black current level.

The described combined-pulse sampling technique is discussed in greater detail in a U.S. patent application Ser. No. 434,314 of R. P. Parker titled "Signal Processing Network For An Automatic Kinescope Bias Control System", incorporated herein by reference. This copending application also discloses additional information concerning the arrangement including auxiliary control signal $V_P$, as well as disclosing a suitable arrangement for timing signal generator 40.

Figure 3:
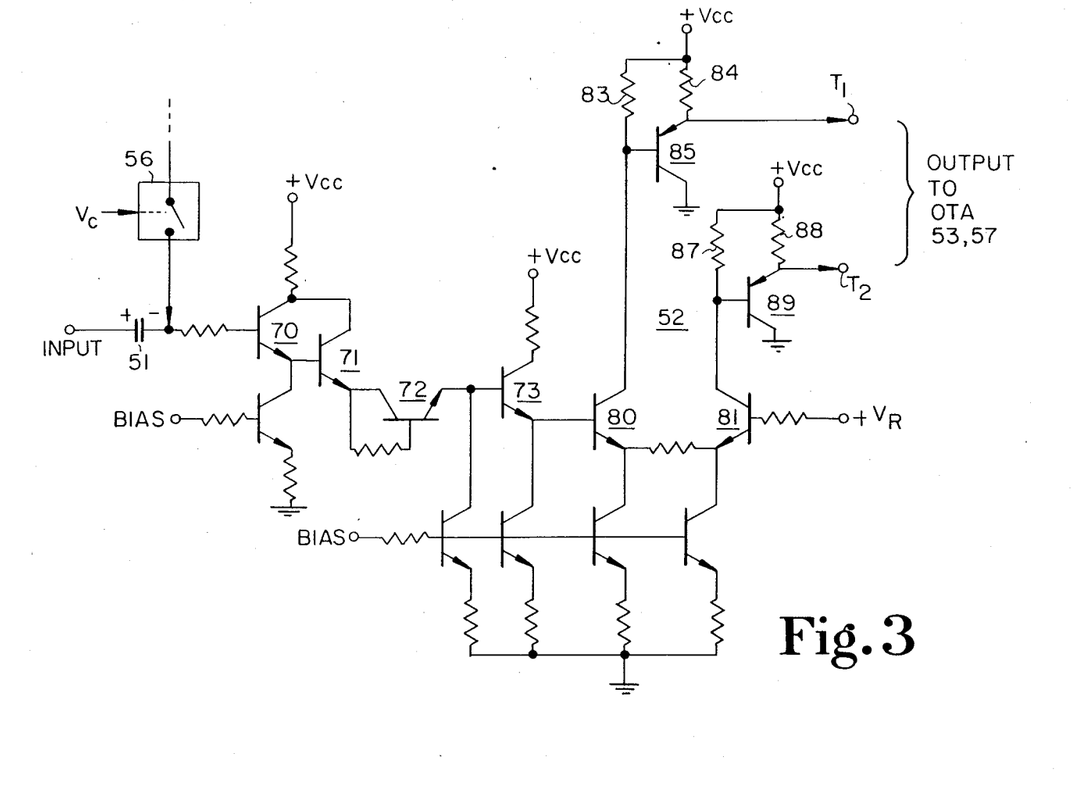
FIGS. 3 and 4 show circuit details of portions of the signal sampling network of FIG. 1.

FIG. 3 shows details of amplifier 52 and associated circuits.

Figure 4:
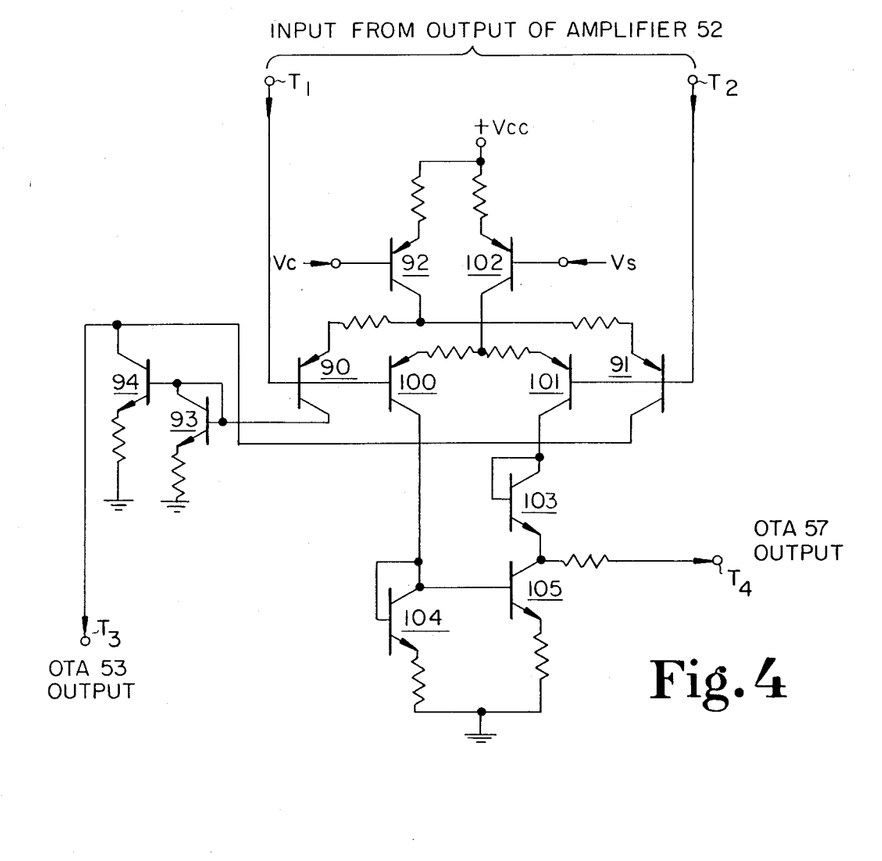

Signals developed at the junction of input capacitor 51 and feedback switch 56 are level shifted by means of a network comprising transistors 70–73 before being applied to amplifier 52. Amplifier 52 comprises differentially connected transistors 80, 81 with balanced differential output circuits respectively comprising resistors 83–84 and an output emitter follower transistor 85, and resistors 87–88 and an output emitter follower transistor 89. The level shifted input signals are applied to the base of transistor 80, and fixed reference voltage $V_{REF}$ is applied to the base of transistor 81. Output signals are applied to OTA 53 and OTA 57 via terminals $T_1$ and $T_2$ as shown in FIG. 4. Amplifier 52 is arranged such that transistors 80 and 81 conduct substantially equal collector currents, and the output voltages at terminals $T_1$ and $T_2$ are substantially equal, when the base voltage of transistor 80 equals reference voltage $V_{REF}$ at the base of transistor 81.

The balanced differential (push-pull) output circuits of amplifier 52 advantageously serve to nullify the effects of common mode interference signals, such as horizontal deflection rate interference which can be coupled via power supply connections. The double-ended differential output also produces greater (i.e., double) effective signal gain compared to a single-ended output.

FIG. 4 shows circuit details of operational transconductance amplifiers 53 and 57. OTA 53 comprises transistors 90, 91 respectively responsive to signals received from amplifier 52 via terminals $T_1$ and $T_2$, and a keyed current source transistor 92. Differential collector output currents of transistors 90, 91 are converted to a single-ended output current, which appears at a terminal $T_3$, by means of a double-ended to single-ended converter circuit comprising transistors 93 and 94. OTA 57 comprises transistors 100 and 101, which also respectively respond to signals received from amplifier 52 via terminals $T_1$ and $T_2$, and a keyed current source transistor 102. Differential collector output currents of transistors 100, 101 are converted to a single-ended output current, which appears at a terminal $T_4$, by means of a double-ended to single-ended converter comprising transistors 103–105.

What is claimed is:

1. Signal processing apparatus operative during a reference interval and a subsequent signal sampling interval, comprising:
   a source of reference voltage;
   biasing means;
   signal utilization means;
   a first amplifier with an input coupled to said biasing means, and an output;
   a second amplifier with an input coupled to said biasing means, and an output;
   first switching means for selectively enabling signals from said output of said first amplifier and a voltage related to said reference voltage to be applied to said biasing means during said reference interval, for establishing a reference condition for said baising means; and
   second switching means associated with said second amplifier for selectively enabling signals from said output of said second amplifier to be applied to said signal utilization means during said sampling interval; wherein
   said first and second amplifiers produce substantially the same output signal at the end of said reference interval.

2. Apparatus according to claim 1, wherein
   said signal utilization means comprises an output capacitance; and
   said biasing means comprises an input capacitance.

3. Apparatus according to claim 1, wherein
   said biasing means comprises an input signal coupling capacitance.

4. Apparatus according to claim 1, wherein
   said first and second amplifiers comprise transconductance amplifiers for providing output currents in response to input voltages.

5. Apparatus according to claim 1, wherein
   said first and second amplifiers are mutually matched to exhibit substantially similar operating characteristics.

6. Apparatus according to claim 1, and further comprising
   an input amplifier for coupling said biasing means to said inputs of said first and second amplifiers, said input amplifier having a signal input coupled to said biasing means, a reference input coupled to said source of reference voltage, and an output coupled in common to said inputs of said first and second amplifiers; and wherein
   said reference condition of said biasing means establishes input and output reference bias conditions for said input amplifier.

7. Apparatus according to claim 6, wherein
   said input amplifier exhibits a gain greater than the individual gains of said first and second amplifiers.

8. Apparatus according to claim 6, wherein
   said biasing means comprises a capacitance for AC coupling signals to said signal input of said input amplifier.

9. Apparatus according to claim 6, wherein
   said output of said input amplifier comprises a differential output network coupled in common to said inputs of said first and second amplifiers.

10. Apparatus according to claim 1, wherein
    said first amplifier is rendered conductive during said reference interval and non-conductive during said sampling interval; and
    said second amplifier is rendered non-conductive during said reference interval and conductive during said sampling interval.

11. Apparatus according to claim 1, wherein said first switching means selectively couples said output of said first amplifier to said biasing means via a reference signal path, from said output of said first amplifier to said biasing means, during said reference intervals; and
    a low pass filter including a capacitance is coupled to said reference path.

12. Apparatus according to claim 11, wherein said biasing means comprises an input capacitance;
    said first switching means comprises a buffer circuit with a high impedance input coupled to said output of said first amplifier and a low impedance output coupled to said input capacitance for supplying current to said input capacitance during said reference interval; and
    said low pass filter is situated between said output of said first amplifier and said input of said buffer circuit.

13. Signal processing apparatus operative during a reference interval and a subsequent signal sampling interval, comprising:
    a source of reference voltage;
    biasing means;
    signal utilization means;
    a first transconductance amplifier with an input coupled to said biasing means, and an output;
    a second transconductance amplifier with an input coupled to said biasing means, and an output;
    first switching means for selectively enabling signals from said output of said first transconductance amplifier and a voltage related to said reference voltage to be applied to said biasing means during said reference interval, for establishing a reference condition for said biasing means; and second switching means associated with said second amplifier for selectively enabling signals from said output of said second transconductance amplifier to be applied to said signal utilization means during said sampling interval.

14. Apparatus according to claim 13, wherein said first and second transconductance amplifiers produce substantially the same output signal at the end of said reference interval, and are mutually matched to exhibit substantially similar operating characteristics.

15. Apparatus according to claim 14, wherein said signal utilization means comprises an output capacitance; and said biasing means comprises an input signal coupling capacitance.

16. In combination with a system for automatically controlling the black image current conducted by an image display device associated with a video signal processing system, said system including means operative during video image blanking intervals for deriving a signal representative of the magnitude of said black image current; apparatus for processing said derived signal during a control interval encompassing a reference interval and a subsequent sampling interval, comprising:

a source of reference voltage;

an input capacitance for receiving said derived signal;

an output capacitance coupled to said signal processing system;

a first amplifier with an input coupled to said input capacitance, and an output;

a second amplifier with an input coupled to said input capacitance, and an output;

first switching means for selectively enabling signals from said output of said first amplifier and a voltage related to said reference voltage to be applied to said input capacitance during said reference interval, for establishing a reference bias condition for said input capacitance; and second switching means associated with said second amplifier for selectively enabling signals from said output of said second amplifier to be applied to said output capacitance during said sampling interval for developing a bias control voltage across said output capacitance in accordance with the magnitude of said derived signal, for maintaining a desired black current level; wherein said first and second amplifiers produce substantially the same output signal at the end of said reference interval.

17. Apparatus according to claim 16, wherein said first and second amplifiers comprise transconductance amplifiers.

18. Apparatus according to claim 16, wherein said first and second amplifiers comprise transconductance amplifiers; and an input amplifier couples said input capacitance to said first and second amplifiers, said input amplifier having a signal input coupled to said input capacitance, and an output coupled in common to said inputs of said first and second amplifiers.

19. Apparatus according to claim 18, wherein said input capacitance comprises an AC coupling capacitor for coupling said derived representative signal to said signal input of said input amplifier.

* * * * *